United States Patent [19]

Kishimoto et al.

[11] Patent Number: 5,153,681
[45] Date of Patent: Oct. 6, 1992

[54] ELECTRCALLY PLASTIC DEVICE AND ITS CONTROL METHOD

[75] Inventors: Yoshio Kishimoto, Hirakata; Mamoru Soga, Osaka; Susumu Maruno, Osaka, all of Japan

[73] Assignee: Matsushita Electric Industrial Co., Ltd., Osaka, Japan

[21] Appl. No.: 836,556

[22] Filed: Feb. 18, 1992

Related U.S. Application Data

[63] Continuation of Ser. No. 556,977, Jul. 24, 1990, abandoned.

[30] Foreign Application Priority Data

| Jul. 25, 1989 | [JP] | Japan | 1-192961 |
| Jan. 29, 1990 | [JP] | Japan | 2-18310 |
| Feb. 15, 1990 | [JP] | Japan | 2-35121 |
| Apr. 27, 1990 | [JP] | Japan | 2-113390 |

[51] Int. Cl.$^5$ .......................................... H01L 29/28
[52] U.S. Cl. ...................................... 357/8; 357/23.5; 357/23.15
[58] Field of Search ................ 357/8, 23.5, 23.15, 357/25, 4, 6, 54; 307/201

[56] References Cited

U.S. PATENT DOCUMENTS

| 4,193,670 | 3/1980 | Giglia et al. | 359/274 |
| 4,204,216 | 5/1980 | Heeger et al. | 357/8 |
| 4,371,883 | 2/1983 | Potember et al. | 357/8 |
| 4,614,575 | 9/1986 | Juda et al. | 204/284 |
| 4,828,756 | 5/1989 | Benton et al. | 252/511 X |
| 4,839,322 | 6/1989 | Yodice | 204/72 X |
| 4,839,700 | 6/1989 | Ramesham et al. | 357/4 |
| 4,873,556 | 10/1989 | Hyodo et al. | 357/8 |

FOREIGN PATENT DOCUMENTS

| 0185941A3 | 7/1986 | European Pat. Off. | |
| 58-12370 | 1/1983 | Japan | 357/8 |
| 58-114465 | 7/1983 | Japan | 357/8 |
| 63-14472 | 1/1988 | Japan | 357/8 |
| 63-200396 | 8/1988 | Japan | |

OTHER PUBLICATIONS

Patent Abstracts of Japan vol. 12, No. 488 (P-803), Dec. 20, 1988 abstracting JP-A-63200396.
Kawano et al., "Japanese Journal of Applied Physics" 28(8) 979-983 (Aug. 1984).
Tsumura et al., "Applied Physics Letters", 49(18) 1210-1212 (Nov. 1986).

Primary Examiner—Andrew J. James
Assistant Examiner—Sara W. Crane
Attorney, Agent, or Firm—Wenderoth, Lind & Ponack

[57] ABSTRACT

This invention provides an electrically plastic device in which an electron conjugated polymeric semiconductor layer containing a mobile dopant is formed across a pair of electrodes and at least one gate electrode is provided between said pair of electrodes with an insulating layer or a high-resistance layer interposed along said electron conjugated polymeric semiconductor layer, so that the dopant distribution in said electron conjugate polymeric semiconductor layer is controlled through said gate electrode, thereby controlling the electrical conductivity of said electron conjugated polymeric semiconductor layer. The device utilizes the substantially large variation in the electrical conductivity of an electrically conductive polymer depending on its dopant concentration, thus allowing a high-gain neurochip to be constructed. The control method of the electrically plastic device in accordance with this invention is carried out in such a way that a positive or negative pulse voltage is applied to the gate electrode to control the dopant distribution in the electron conjugated polymeric semiconductor layer, thereby varying the conductivity thereof, which is used as a learning or reset operation so as to make said gate electrode at ground potential so that the pair of electrodes (source and drain) are driven into conduction.

12 Claims, 4 Drawing Sheets $$P + A^- \rightleftarrows P^+ \cdot A^- + e^-$$
$$D^+ \cdot + e^- \rightleftarrows D^\circ$$

ELECTRCALLY PLASTIC DEVICE AND ITS CONTROL METHOD

This application is a continuation of now abandoned application Ser. No. 07/556,977 filed on Jul. 24, 1990.

BACKGROUND OF THE INVENTION

1. Field of the Invention

This invention relates to a semiconductor device having a novel electrical plasticity used for information processing through a neural network and further to the control method thereof.

The plastic device herein mentioned refers to a device which shows non-linear electrical characteristics, i.e. those in electrical conductivity and capacity, depending on the energy of input, more specifically on its amount or change with time.

2. Description of the Prior Art

The information processing through a neural network, although a fine information processing performed in brains of living things, has so far been accompanied by a problem in that there is no quality electronic device which functions like a synapse. This problem has confronted future information processing.

The neurochips having already been proposed can be classified into two types, semiconductor devices and optical devices. Although the neurochips using semiconductor devices have greater feasibility, they include none having appropriate characteristics for electronic devices having the plastic function. The result is that bipolar devices or CMOSs using a silicon semiconductor or the like are being improved as the devices performing analog operations for the development of a neural network.

On the other hand, the devices which are discussed for serving like a synapse to give the neural network a plastic function include the field-effect transistor (FET), transconductance amplifier (OTA), capacitor array, switched register, and so forth. Among them, the FET has excellent features such as low power and high gain, and those such as floating gates for EPROMs and MNOSs are attracting the eyes of those skilled in the art.

As for electrically conductive polymers, it is common knowledge that they are composed of polymers having large-extended conjugated $\pi$ electron systems such as polyacetylene, polypyrrole, polythiophene, polyaniline, polyacene, and so forth, and contain electron donors (e.g. metal ions) or electron acceptors (anions such as Lewis acid or protonic acid) as a dopant, thus showing a high electrical conductivity. The resultant dopant, however, has had a large drawback that it will be diffused in a polymer matrix due to an electric field, thereby causing its conductivity to be varied.

Molecule-based transistors that have made use of the above drawback in turn are disclosed in Journal of American Chemical Society, 106, p.5375, 1984 edition by M.S. Wrighton et al., and ibid. 109, p.5526, 1987 edition by M.S. Wrighton.

Furthermore, an electrically conductive variable device intended for a plastic device is disclosed in Japanese Patent Laid-Open No. 63-200396.

However, the conventional devices described above have been unsatisfactory in that they have neither appropriate characteristics for an electronic device nor those for a plastic device.

It is therefore the primary object of this invention to provide an electrically plastic device having high-gain high-performance characteristics using a novel electrical control device. Another object of this invention is to provide a control method for this electrically plastic device.

This invention provides an electrically plastic device in which an electron conjugated polymeric semiconductor layer containing a dopant or a multilayer structure comprising an electron conjugated polymeric semiconductor layer and a mobile dopant retaining layer is formed between or across a pair of electrodes, and at least one gate electrode is provided between the pair of electrodes with an insulating layer or a high-resistance layer interposed along the electron conjugated polymeric semiconductor layer, wherein the dopant distribution in the electron conjugated polymeric semiconductor layer or mobile dopant retaining layer is controlled through the gate electrode, thereby controlling the conductivity of the electron conjugated polymeric semiconductor layer.

One of the control methods for electrically plastic devices in accordance with this invention is carried out in such a way that a positive or negative pulse voltage is applied to the gate electrode to control the dopant distribution in the electron conjugated polymeric semiconductor layer, thereby varying the conductivity thereof, which is used as a learning or reset operation to make the gate electrode at ground potential so that a pair of electrodes (source and drain) are driven into conduction. Another control method for the same is such that the gate electrode is short-circuited to one of the pair of electrodes (source) and a positive or negative pulse voltage is applied between the pair of electrodes so as to control the dopant distribution in the electron conjugated polymeric semiconductor layer, thereby varying the conductivity thereof, which is used as a learning or a reset operation so that the pair of electrodes are driven into conduction with a voltage lower than the pulse voltage.

The electrically plastic device of this invention can control the dopant distribution in the electron conjugated polymeric semiconductor layer or dopant retaining layer through the gate voltage, thereby varying the electrical conductivity of the electron conjugated polymeric semiconductor layer, capable of amplifying the current across a pair of electrodes (equivalent to source and drain of FET) to a large extent, allowing them to be switched.

This electrically plastic device, whose operation is equivalent to the FET operation of a dopant mobile semiconductor, has excellent memory type non-linear electrical characteristics practically usable as a plastic device. More precisely, in the electrically plastic device of this invention, when a voltage is applied to the gate electrode, it will be subjected to a substantial change in channel impedance as the number of carriers due to field effect is affected by the time-varying dopant concentration. This movement of the dopant is of a memory type and would never be done without gate electric field. Accordingly, when a network is formed of the plastic devices in accordance with this invention, a superior neural network with a high S/N ratio may be formed by virtue of a high change ratio in its channel impedance.

DETAILED DESCRIPTION OF THE PREFERRED EMBODIMENT

Figure 1:
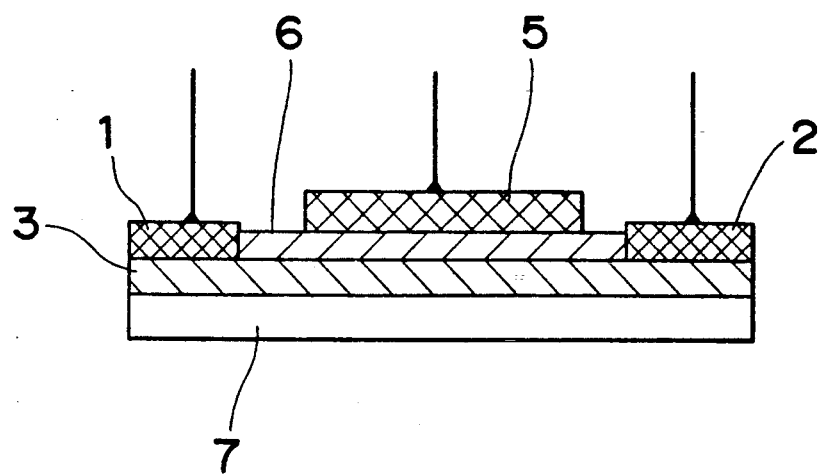
FIGS. 1 and 2 are sectional conceptual views each showing an example of an electrically plastic device in accordance with this invention.

FIG. 1 shows a sectional conceptual view illustrating an example of an electrically plastic device of this invention. On a substrate 7, there is formed an electron conjugated polymeric semiconductor layer 3 containing a dopant, whereon are provided a pair of electrodes 1 and 2, and at least one gate electrode 5 is provided between the pair of electrodes 1 and 2 with an insulating layer 6 interposed.

For the material of the electron conjugated polymeric semiconductor layer 3, polythiophene, polypyrrole, poly-p-phenylene, and their copolymers and derivatives are used.

The electron conjugated polymer for this purpose is preferably supplied by synthesis through electrolytic polymerization (anodic oxidation polymerization or cathodic reduction polymerization) and a polymer derived from chemical polymerization may also be used.

Anodic oxidation polymerization is that a dopant is dissolved into an electron conjugated monomer solution and, under an electric field generated between at least one pair of electrodes, the electron conjugated monomer is electrolytically polymerized onto the anode with the result of obtaining an electrically conductive polymer into which the dopant has been dispersed.

This method enables a molecular ordered film to be formed easily and uniformly, thereby facilitating the constructing of high-speed responsive devices.

Furthermore, if both the dopant, imparting electronic conductivity, and the plasticizer dissolving the dopant are dispersed into a polymer having long $\pi$ electron conjugated principal chains, an electron conjugated polymeric semiconductor layer having a high level of dopant mobility can be obtained, hence an electrically plastic device having a high speed response.

Referring now to the operation of this invention, when a current source is connected across the electrodes 1 and 2, and a gate voltage to be applied to the gate electrode 5 is controlled, the channel impedance in the electron conjugated polymeric semiconductor layer 3 between the electrodes 1 and 2 will be controlled by the gate voltage. That is, the dopant concentration in the electron conjugated polymeric semiconductor layer 3 will be varied correspondingly to the gate voltage, thereby the channel impedance to be varied.

The channel impedance across the source and the drain of this electrically plastic device is dependent on the dopant concentration in the channel (equivalent to the impurity concentration of a semiconductor), so that the lower the impedance, the more the drain current. An electron conjugated polymeric semiconductor features the fact that the electrical conductivity thereof will be greatly varied from insulator to conductor depending on its dopant concentration. The present invention is intended put this feature of the electron conjugated polymeric semiconductor to the best use.

The dopant in this invention is mobile and its polarity is reverse to that of the charge carriers of the electron conjugate polymeric semiconductor, so that the electrical conductivity of the channel will be largely varied in the reverse direction against the variation of conduction due to the FET principle. In addition, it is also possible that the mobility of the dopant has exact threshold values through the selection of selection of the dopant, i.e. its ionic radius and the amount of electric charge.

Figure 8:
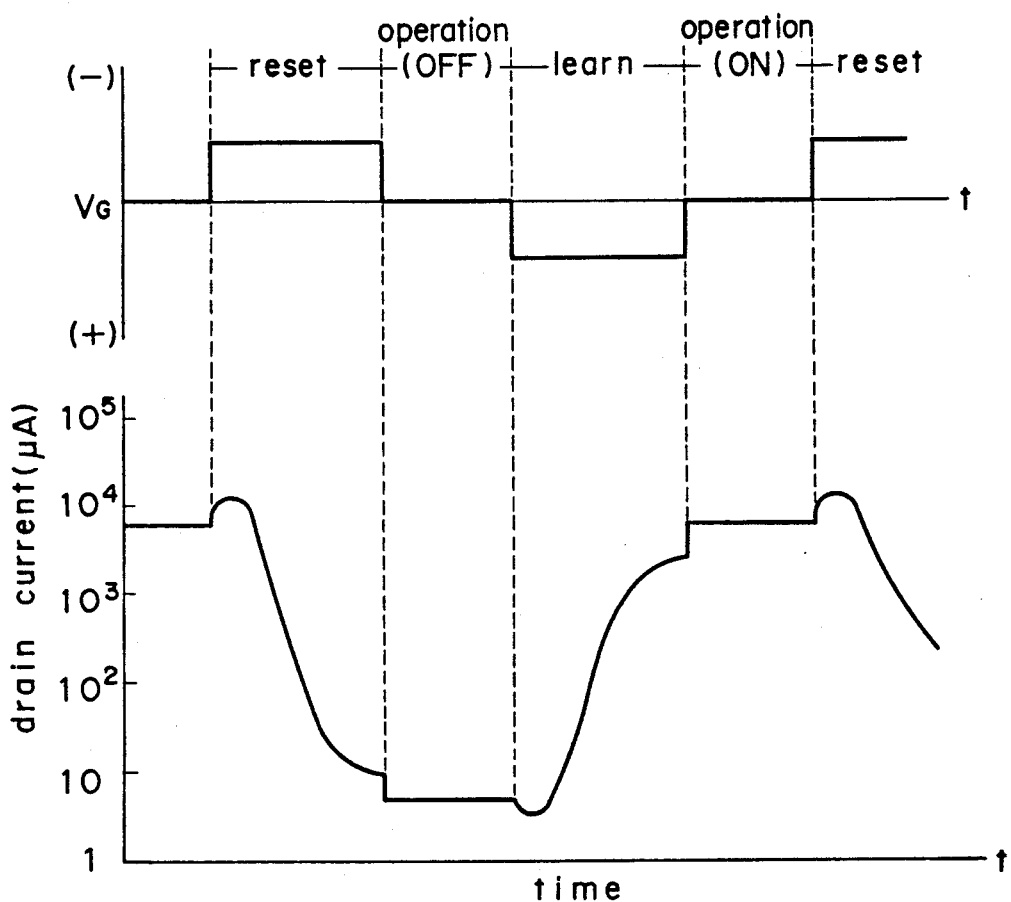
FIG. 8 is a chart showing the drain current response corresponding to gate voltages of the electrically plastic device of this invention.

FIG. 8 illustrates the operation characteristics showing the drain current response corresponding to the gate voltage in the case where a p-type electron conjugated polymeric semiconductor and an anionic dopant are used for the electrically plastic device as an example. This figure is taken from a case in which the pulse width is longer than the movement of the dopant, where the gate voltage is varied to the three steps, a positive pulse voltage, a negative pulse voltage, and ground voltage. The response of field effect is in the order of microseconds, and the movement of iopant is in the order of milliseconds.

Figure 9:
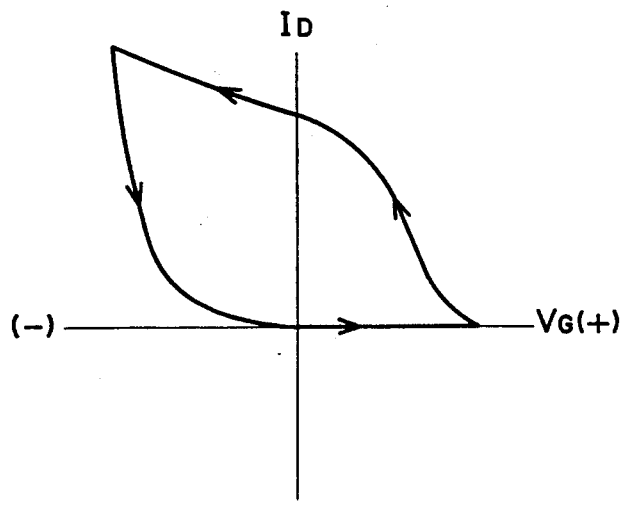
FIG. 9 is a chart showing the drain current-gate voltage ($I_D-V_G$) of the device of this invention.

The state of the operation of this device can be represented as in FIG. 9 from the viewpoint of $I_D-V_G$ characteristic, equivalent to such a characteristic just as MOSFETs of enhancement type and depression type are combined.

Figure 10:
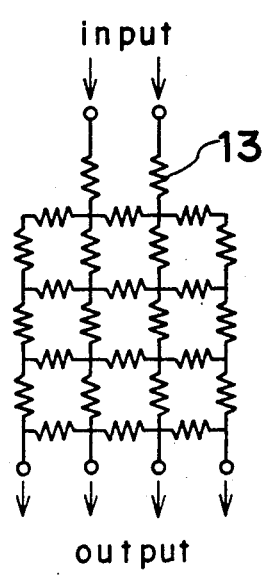
FIG. 10 is a view showing an example of the neural network of this invention.

Using this electrically plastic device, when an electrically plastic device 13 is connected in a network shape as shown in FIG. 10, and subjected to a learning with a positive gate pulse and a reset with a negative gate pulse as shown in FIG. 8, only the device in the network subjected to the learning results in an extremely low impedance, thus a neural network being formed. This device, although taking a time in the order of milliseconds for the learning and the reset, features allowing its conduction after the learning to respond in microseconds. Accordingly, although the learning and the reset of the electrically plastic device take milliseconds for response, the operation thereof as a neural network makes use of the electronic conductivity of the channel so that the device can operate in microseconds or lower.

As will be understood from the above description, the device of this invention is a semiconductor device having an excellent plasticity with a substantially large variation in electrical conductivity, usable for information processing through a neural network.

Moreover, when a plurality of such electrically plastic devices are used in connection as shown in FIG. 10, IC devices can be constructed in the same manner as in semiconductor integrated circuit process, thereby allowing a neural network to be constructed on a chip and hence make a large contribution toward information processing.

Figure 2:
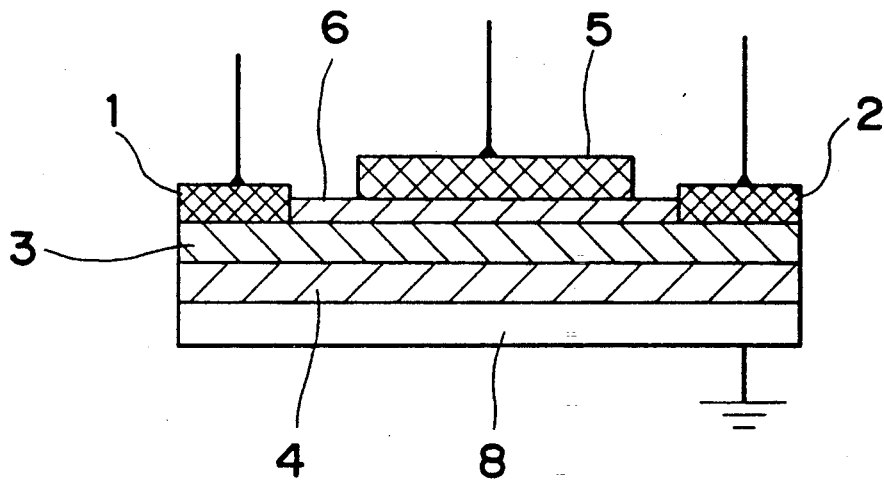

FIG. 2 shows an example of the electrically plastic device with a higher performance having been formed up by overlaying a mobile dopant retaining layer 4 and an electron conjugate polymeric semiconductor layer 3 onto an electrically conductive substrate 8.

The mobile dopant retaining layer 4 is a layer so constructed as to allow the dopant easily to move, therefore being preferably of a low conductivity. The layer may also be an electrically conductive anisotropic film having a high insulating characteristic in the direction of the layer and a high conductivity in the orthogonal direction thereof.

In the device represented in FIG. 2, due to the movement of the dopant under the electric field, ion radicals of the inverse polarity to that of the dopant occur in the electron conjugated polymer into which the foregoing dopant has penetrated. On the other hand, ions of the inverse polarity remaining in the dopant retaining layer 4 will undergo a redox. The dopant retaining layer 4, therefore, must be of a substance being reversible and stable against the redox. The construction above mentioned can make reversible and stable this electrical redox in the dopant retaining layer 4 which occurs during the operation of the gate electrode. When the ion radical is an electron donor (D), $(D.^+ + e^- \rightleftarrows D^0)$ is steadily repeated, while, when an electron acceptor, $(A.^- \rightleftarrows A + e^-)$ is steadily repeated. For a p-type electron conjugate polymer, anion dopant is doped by the gate electrode thereby increasing the electrical conductivity thereof, with + charges of cationic radicals remaining in the dopant retaining layer 4. These charges are then reduced by the electrons from the inverse electrode, returning to neutral. And vice versa for an n-type polymer. Thus, in the dopant retaining layer 4 the redox reaction is reliably repeated.

The mobile dopant retaining layer 4 is formed of a layer made up by dissolving into an ionic polymer a dopant primarily comprising electron donors (metal ions or the like) or electron acceptors (anions such as Lewis acid and proton acid), the layer is also an ion conductive polymeric compound. It is preferable that the mobile dopant retaining layer 4 comprises a polymer complex layer formed of a dopant and a polymer, in which the mobility of the dopant may have exact threshold values, this case including ionic clathrate compounds or polyion complexes.

For the clathrate compounds, a polymer having an alkylene oxide construction such as crown ether or polyethlene oxide is appropriate, while the polymers used for the polyion complexes include polymers containing amino groups, polyurethane, polyamide, polyacrylic acid, polyester, and other like polar polymers.

For the mobile dopant retaining layer 4, the construction utilizing an ionic radical contained polymeric compound including a mobile dopant is the simplest and preferred in practice, while the ion radical of the inverse polarity to the dopant is preferably of immobility, i.e. an ion radical of a high bulky molecular weight.

This ionic radical contained polymer compound including the mobile dopant comprises at least one of the following types:

(a) a low-conductivity electron conjugated polymeric compound containing a mobile dopant, (b) a polymeric compound into which a salt out of a mobile dopant and an inversely charged ionic radical is dispersed, (c) a polymeric complex formed of a mobile dopant and an ionic radical polymer, and (d) a low-conductivity compound formed of a mobile dopant contained high-conductivity electron conjugated polymer and an insulating polymer, each of which is detailed below:

(a) The low-conductivity electron conjugated polymeric compound containing a mobile dopant comprises a polymer having $\pi$ electron conjugated side chains or that including no long-distance electron conjugated main chain, which includes numerous low-conductivity polymers such as, specifically, phenyl-substituent polyacetylene, thiophene copolymer, pyrrole copolymer, and polyvinyl carbazole.

(b) The polymeric compound into which a salt made of a mobile dopant and an inversely charged ionic radical is dispersed has such a structure that a salt having, as ion radicals, heterocyclic cationic radicals containing nitrogen and/or sulfur or anionic radicals such as haloquinone and cyanoquinone has been molecularly dispersed into a compatible polymer, the construction being possible obtained by a large number of charge-transfer type organic semiconductor molecularly dissolved in a polar polymer. For this polar polymer, a polymer containing nitrogen or sulfur is suitable, specifically such as an amino-group contained polymer, polyurethane, polyamide, and polyester.

(c) The ionic radical polymer here used may be either a cationic radical polymer or an anionic radical polymer, whereas a cationic radical polymer having in its side chains or main chains heterocyclic cationic radicals containing nitrogen and/or sulfur is the most conveniently available, such as polymers containing pyridine rings, pyrimidine rings, triazine rings, imidazole rings, thiazole rings, thiopyran rings, thiophene rings, pyrrole rings, indole rings, and quinoline rings.

(d) For the low-conductivity compound made of a mobile dopant contained high-conductivity electron conjugated polymer and an insulating polymer, such a compound with an arbitrary electrical conductivity may simply be derived by compounding an electron conjugated polymer containing the dopant with a high conductivity and an insulating polymer.

Figure 3:
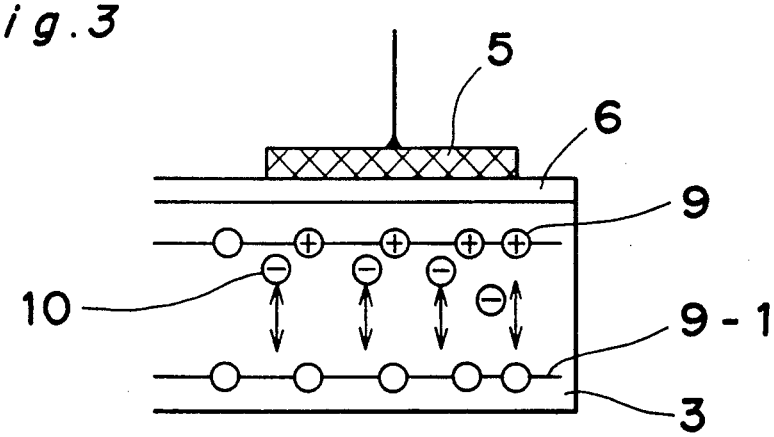
FIG. 3 is a view typically showing the movement of anion dopant when a p-type electron conjugated polymeric semiconductor is used.

FIG. 3 typically illustrates the movement of the dopant within the electrically plastic device in FIG. 2, wherein on an electron conjugated polymeric semiconductor layer 3 including p-type electron conjugated polymeric semiconductor 9, 9-1 and anionic dopant 10 there is provided a gate electrode 5 therebetween with an insulating layer interposed. The anionic dopant 10 in this invention is mobile and moreover has the polarity opposite to that of the p-type electron conjugated polymeric semiconductor 9, 9-1, so that the dopant will move in the direction of the layer thickness correspondingly to the voltage applied to the gate electrode, thus the channel impedance being subjected to a considerable change by the effect of the movement of the anionic dopant 10. This moving speed of the dopant can be determined depending on the amount of charge, ionic radius, type of polymer, density, internal viscosity, temperature, and the like of the dopant.

Figure 4:
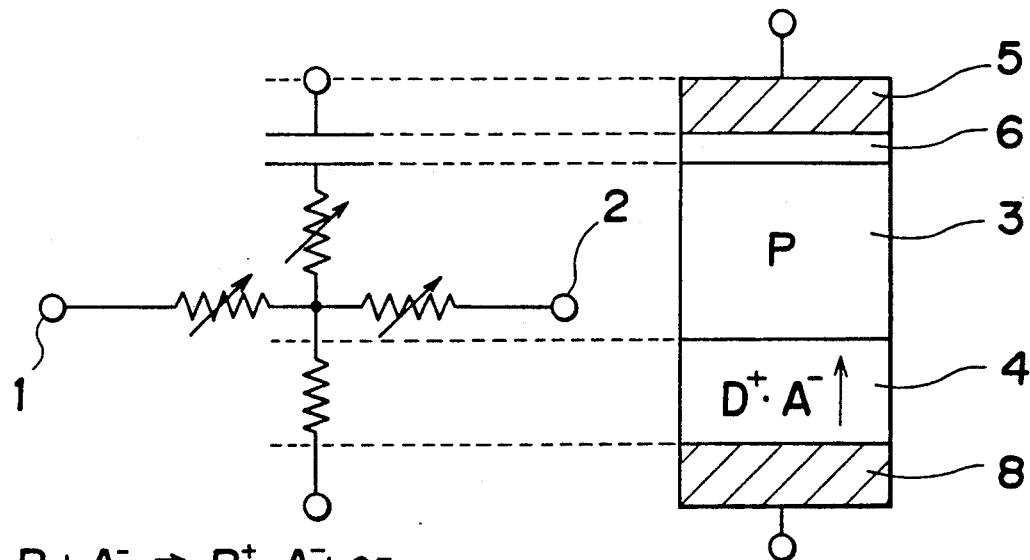
FIGS. 4 and 5 are views showing the equivalent circuit of the device in accordance with this invention and the correlation and principle of the device configuration.
Figure 5:
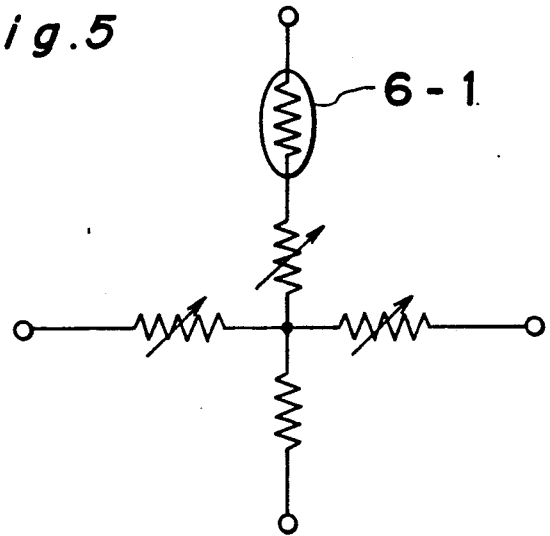

The equivalent circuit and principle of such a device in accordance with this invention are shown in FIGS. 4 and 5. FIG. 5 depicts an example of the device construction wherein the insulating layer 6 at the gate in FIG. 4 is replaced by a high resistance layer 6-1 having a low insulation resistance. The high-resistance layer 6-1 at the gate is preferably made from a material having an electrical resistivity of $10^5$ to $10^{12}$ $\Omega$.cm. It is furthermore necessary that the electrical conductivity of the electron conjugated polymeric semiconductor layer 3 between a pair of electrodes after doping be markedly higher than that of the mobile dopant retaining layer 4, as is apparent from the equivalent circuit shown here. The device in accordance with this invention is characterized by its capability of forming a high-gain device making use of its feature that the electrical conductivity of the conductive polymer will widely vary up to a range of 10 orders of magnitude in the direction of the film, i.e., that of source to drain. On the other hand, the device will allow a high strength of electric field to be applied in the thickness direction, thereby rendering the response speed faster.

Although FIG. 3 shows, for the sake of explanation, only an example utilizing the p-type electron conjugated polymeric semiconductor layer 9, 9-1 and the anionic dopant 10, it will be apparent to the skilled in the art that this invention is not limited to this example and this is the case also when cationic dopant is doped into an n-type electron conjugated polymeric semiconductor.

The electrically plastic device of this invention may be constructed not only with three terminals but also with four terminals, for example, taking a substrate terminal using silicon single crystal having an $SiO_2$ insulating surface. In this case, the control characteristic thereof will be of a higher precision and bistable.

Figure 6:
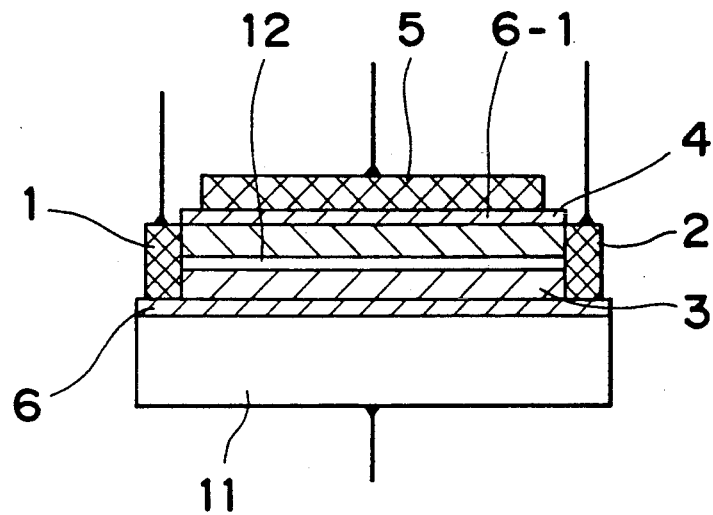
FIGS. 6 and 7 are views each showing an example of the construction of four and two terminals, respectively, in the device of this invention.

FIG. 6 illustrates an example of the four-terminal device, wherein the four-terminal electrically plastic device is so constructed that on a gate electrode 11 comprising a semiconductor substrate having an insulating film 6 on its surface there is provided an electron conjugated polymeric semiconductor layer 3 and a mobile dopant retaining layer 4 are overlaid with a dopant penetrating separation layer 12 interposed therebetween.

The dopant penetrating separation layer 12 interposed between the electron conjugated polymeric semiconductor layer 3 and the dopant retaining layer 4 serves to accurately control the dopant distribution, thereby stabilizing the switching current between a pair of electrodes. For this dopant penetrating separation layer 12, an ion penetrating porous film or the like may be used; for example, a separator material is suitable therefor.

At both ends of the electron conjugated polymeric semiconductor layer 3 and the dopant retaining layer 4 there are provided electrodes 1 and 2. On the mobile dopant retaining layer 4 there is provided a gate electrode 5 with a high-resistance layer 6-1 interposed therebetween. A drive power supply is connected between the electrodes 1 and 2.

A control voltage in the form of pulse voltage is applied to each of gate electrodes 5 and 11, and the dopant distribution will accurately be controlled by controlling the amount, phase, and the like of the pulse voltage for both electrodes.

Figure 7:
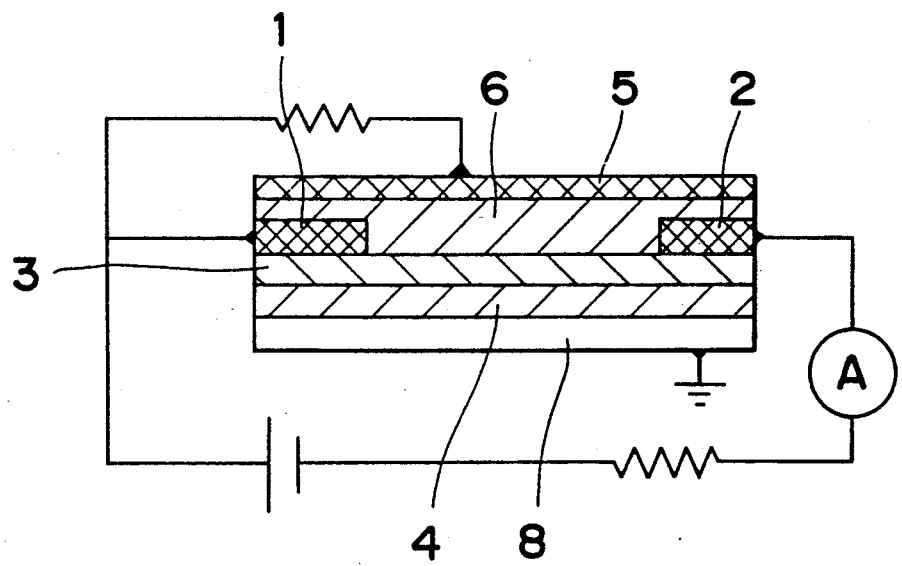

This invention may also be constructed for a two-terminal plastic device such as shown in FIG. 7, wherein the gate electrode 5 is short-circuited with one of the pair of electrodes 1 and 2, e.g. with the source electrode 1, and a positive or negative pulse voltage is applied between the pair of electrodes 1 and 2 to control the dopant distribution in the electron conjugated polymeric semiconductor layer 3 or the dopant retaining layer 4, thereby varying the electrical conductivity for learning or reset operation, while a voltage lower than the pulse voltage is applied between the pair of electrodes 1 and 2 for driving into conduction.

As described hereinabove, the electrically plastic device of this invention is bistable and performs switching in connection with time and the amount of current, thus being useful for artificial intelligence devices (neurochips). If IC devices are formed in the same manner as in the semiconductor integrated circuit process using a plurality of such electrically plastic devices, neuronetwork devices can easily be formed up.

Now the invention will be described with reference to several embodiments.

EXAMPLE 1

As shown in FIG. 2, on an electrically conductive substrate 8, there were formed a 5 $\mu$m thick dopant retaining layer 4 and an electron conjugated polymeric semiconductor layer 3 comprising a 10 $\mu$m thick polythiophene layer by overlaying them, where a pair of electrodes 1 and 2 were provided thereon and a gate electrode 5 was provided therebetween with an insulating layer 6 interposed. For the dopant retaining layer 4, a perchlorate derived from a copolymer of 2-vinylpyridine and vinyl acetate was used. Thus, an electrically plastic device was obtained.

When a pulse voltage was applied to the gate electrode 5 of this device into operation, the device has such non-linear switching characteristics as shown in FIG. 9. Making use of this operation, the device may be subjected to a learning with a positive gate pulse and be reset with a negative pulse, as shown in FIG. 8.

With this device in use for forming up the neural network shown in FIG. 10, when a voltage was applied across an arbitrary pair of I/O terminals, only the portion of the device along the shortest course from the input terminal to the output terminal resulted in an extremely low impedance, so that the device could experience the learning of the relation between the input and output as a change in the resistivity thereof.

EXAMPLE 2

As shown in FIG. 7, on an electrically conductive substrate 8, there were formed a 20 $\mu$m thick dopant retaining layer 4 and a 10 $\mu$m thick electron conjugate polymeric semiconductor layer 3 by overlaying them one after another, where a pair of electrodes 1 and 2 and an insulating layer 6 were formed thereon and a gate electrode 5 was provided further thereon, thus constructing an electrically plastic device. For the mobile dopant retaining layer 4, a perchlorate derived from a copolymer of 4-vinylpyridine and vinyl acetate was used. In the electrically plastic device thus obtained, the gate electrode 1 thereof was short-circuited with the source electrode 1 so as to make the device experience a learning with a positive gate pulse of 10 V and reset with a negative gate pulse of 10 V, so that it has shown a change of up to $10^6$ of the channel impedance.

With this device in use for forming the neural network shown in FIG. 10, when a voltage was applied across an arbitrary pair of I/O terminals, only the portion of the device along the shortest course from the input terminal to the output terminal resulted in an extremely low impedance, so that the device could experience the learning of the relation between the input and output as a change in the resistivity thereof.

EXAMPLE 3

As shown in FIG. 2, on an electrically conductive substrate 8, there were formed a 6 $\mu$m thick dopant retaining layer 4 and an electron conjugated polymeric semiconductor layer 3 comprising a 11 μm thick polypyrrole layer by overlaying them, where a pair of electrodes 1 and 2 were formed thereon and a control electrode 5 was provided therebetween with an insulating layer 6 interposed. For the mobile dopant retaining layer 4, polydiphenyl acetylene was used. The electrically controlled device thus obtained, when put into operation, has shown such switching characteristics as in FIG. 9.

EXAMPLE 4

As shown in FIG. 7, on an electrically conductive substrate 8, there were formed a 10 μm thick dopant retaining layer 4 and an electron conjugated polymeric semiconductor layer 3 comprising a 8 μm thick polypyrrole layer by overlaying them, where a pair of electrodes 1 and 2 and an insulating layer 6 were formed thereon and a control electrode 5 was further provided on the insulating layer, and the control electrode 5 was short-circuited with the source electrode 1 with a resistor, thus constructing a two-terminal electrically control device. For the mobile dopant retaining layer 4, a polyvinyl chloride compound in which a 30% perchlorate of 2,3,4,5-tetra-(4-pyridine) thiophene was dispersed was used. With the electrically controlled device thus obtained in use for forming up a nonlinear resistive neuro network, when the device was put into operation, a network having a resistance pattern corresponding to the learning signals could be created.

EXAMPLE 5

As shown in FIG. 6, on a silicon substrate 11 including an oxidized insulating film 6, there were formed a 5 μm thick dopant retaining layer 4 and an electron conjugated polymeric semiconductor layer 3 comprising a 10 μm thick polypyrrole layer by overlaying them with a dopant penetrating separation layer 12 interposed therebetween, where a pair of electrodes 1 and 2 and a high-resistance layer 6-1 were provided thereon and a control electrode 5 was further provided on the high-resistance layer, thus constructing an electrically controlled device. For the mobile dopant retaining layer 4, a compound of polyvinyl quinoline tetraborate and urethane was used. The electrically controlled device thus obtained, when put into operation, has shown switching characteristics and source-drain current time-characteristics similar to that of Example 1.

What is claimed is:

1. An electrically plastic device having a MOS-FET structure wherein an electron conjugated polymeric semiconductor layer containing a mobile dopant for imparting electronic conductivity is formed between a pair of electrodes and at least one gate electrode is provided between said pair of electrodes with an insulating layer or a high-resistance layer interposed along said electron conjugated polymeric semiconductor layer, so that dopant distribution in said electron conjugated polymeric semiconductor layer is controlled by said gate electrode to control the electronic conductivity of an FET channel consisting of said electron conjugated polymeric semiconductor layer.

2. The electrically plastic device having a MOS-FET structure as claimed in claim 1, wherein said electron conjugated polymeric semiconductor layer comprises a mobile dopant for imparting electronic conductivity, a polymer having a long π electron conjugated main chain, and a plasticizer dissolving said dopant.

3. The electrically plastic device having a MOS-FET structure as claimed in claim 1, wherein said electron conjugated polymeric semiconductor layer is at least one member selected from the group consisting of electrolytically polymerized polythiophene, polypyrrole, poly-p-phenylene, and their copolymers and derivatives.

4. An electrically plastic device having a MOS-FET structure wherein an electron conjugated polymeric semiconductor layer and a dopant retaining layer consisting of an ionic radical containing polymeric compound including a mobile dopant or of a polymeric complex with a mobile dopant, are formed between a pair of electrodes and at least one gate electrode is provided between said pair of electrodes with an insulating layer or a high-resistance layer interposed along said electron conjugated polymeric semiconductor layer, so that dopant distribution in said electron conjugated polymeric semiconductor layer is controlled by said gate electrode to control the electronic conductivity of an FET channel consisting of said electron conjugated polymeric semiconductor layer.

5. The electrically plastic device having a MOS-FET structure as claimed in claim 4, wherein the ionic radical containing polymeric compound is at least one selected from (a) a low-conductivity electron conjugated polymeric compound containing a mobile dopant, (b) a polymeric compound in which a salt made of a mobile dopant and an inverse-polar ion radical is dispersed, (c) a polymer complex of a mobile dopant and an ion radical polymer, and (d) a low-conductivity electron conjugated polymer and an insulating polymer.

6. The electrically plastic device having a MOS-FET structure as claimed in claim 5, wherein the dopant containing low-conductivity electron conjugated polymeric compound comprises a polymer having a π electron conjugated side chain or a polymer having no long-distance electron conjugated main chain therein.

7. The electronically plastic device having a MOS-FET structure as claimed in claim 5, wherein the polymeric compound of (b) comprises a salt of heterocyclic cationic radicals containing nitrogen and/or sulfur or of anionic radicals of haloquinone or cyanoquinone, and a compatible polymer.

8. The electrically plastic device having a MOS-FET structure as claimed in claim 5, wherein the ion radical polymer of (c) is a polymer having heterocyclic cationic radicals containing nitrogen and/or sulfur in its side chain or main chain.

9. The electrically plastic device having a MOS-FET structure as claimed in claim 4, wherein the polymeric complex with a mobile dopant is an ion chelate compound of a polyion complex with said mobile dopant.

10. The electrically plastic device having a MOS-FET structure as claimed in claim 9, wherein the ion chelate compound is a crown ether or polyethylene oxide.

11. An electrically plastic device having a MOS-FET structure wherein a multilayer comprising an electron conjugated polymeric semiconductor layer, a dopant penetrating layer, and a dopant retaining layer is formed between a pair of electrodes, a first gate electrode being provided on said electron conjugated polymeric semiconductor layer with an insulating layer interposed therebetween and a second gate electrode being provided on said dopant retaining layer with a high-resistance layer interposed therebetween, so that dopant distribution in said electron conjugated polymeric semiconductor layer is controlled by said gate electrodes to control the electronic conductivity of an FET channel consisting of said electron conjugated polymeric semiconductor layer.

12. The electrically plastic device having a MOS-FET structure as claimed in claim 11, wherein the first electrode is a semiconductor substrate.

* * * * *